US012628367B2

(12) United States Patent
Lee et al.

(10) Patent No.: US 12,628,367 B2
(45) Date of Patent: May 12, 2026

(54) VERTICAL TRANSISTORS HAVING IMPROVED CONTROL OF PARASITIC CAPACITANCE AND GATE-TO-CONTACT SHORT CIRCUITS

(71) Applicant: International Business Machines Corporation, Armonk, NY (US)

(72) Inventors: ChoongHyun Lee, Chigasaki (JP); Ardasheir Rahman, Schenectady, NY (US); Xin Miao, San Jose, CA (US); Brent A. Anderson, Jericho, VT (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 513 days.

(21) Appl. No.: 17/524,062

(22) Filed: Nov. 11, 2021

(65) Prior Publication Data

US 2023/0142760 A1 May 11, 2023

(51) Int. Cl.
| | |
|---|---|
| *H10D 30/01* | (2025.01) |
| *H10D 64/01* | (2025.01) |
| *H10D 84/01* | (2025.01) |
| *H10D 84/03* | (2025.01) |
| *H10D 84/83* | (2025.01) |
| *H10D 84/85* | (2025.01) |

(52) U.S. Cl.
CPC ........... *H10D 30/025* (2025.01); *H10D 64/01* (2025.01); *H10D 84/0133* (2025.01); *H10D 84/016* (2025.01); *H10D 84/0195* (2025.01);

*H10D 84/038* (2025.01); *H10D 84/83* (2025.01); *H10D 84/85* (2025.01)

(58) Field of Classification Search
None
See application file for complete search history.

(56) References Cited

U.S. PATENT DOCUMENTS

| | | | |
|---|---|---|---|
| 10,438,949 B2 | 10/2019 | Cheng et al. | |
| 10,453,934 B1 | 10/2019 | Basker et al. | |
| 10,529,716 B1 * | 1/2020 | Lee .................. | H01L 21/02532 |
| 10,566,444 B2 | 2/2020 | Zhang et al. | |
| 10,777,679 B2 | 9/2020 | Lee et al. | |
| 10,833,155 B2 | 11/2020 | Yeh et al. | |
| 10,957,693 B2 | 3/2021 | Miao et al. | |
| 10,978,576 B2 | 4/2021 | Liu et al. | |
| 11,018,240 B2 | 5/2021 | Cheng et al. | |
| 2019/0027586 A1 * | 1/2019 | Zang .................. | H01L 29/6656 |
| 2020/0043916 A1 * | 2/2020 | Miao .................. | H10D 30/6728 |
| 2020/0357920 A1 | 11/2020 | Song et al. | |
| 2021/0035867 A1 | 2/2021 | Xie et al. | |

* cited by examiner

*Primary Examiner* — Sarah K Salerno
(74) *Attorney, Agent, or Firm* — CANTOR COLBURN LLP; Samuel Waldbaum

(57) ABSTRACT

Embodiments of the invention are directed to a method of forming an integrated circuit (IC). The method includes performing fabrication operations that form the IC. The fabrication operations include forming a channel fin. A gate structure is formed along a sidewall surface of the channel fin. The gate structure includes a conductive gate having an L-shape profile, and the L-shape profile includes a conductive gate foot region. The conductive gate foot region is replaced with a dielectric foot region.

20 Claims, 11 Drawing Sheets

VERTICAL TRANSISTORS HAVING IMPROVED CONTROL OF PARASITIC CAPACITANCE AND GATE-TO-CONTACT SHORT CIRCUITS

BACKGROUND

The present invention relates in general to semiconductor devices and their fabrication. More specifically, the present invention relates to improved fabrication methodologies and resulting structures for vertical-transport field effect transistors (VTFETs) configured and arranged to provide improved control over parasitic capacitance (e.g., gate-to-gate, gate-to-source, gate-to-drain, etc.), as well as improved control over electrical short circuits that can occur between the VTFET gate and a bottom source or drain (S/D) contact formed in a relatively small spaces.

Semiconductor devices are typically formed using active regions of a wafer. In an integrated circuit (IC) having a plurality of metal oxide semiconductor field effect transistors (MOSFETs), each MOSFET has a source and a drain that are formed in an active region of a semiconductor layer by incorporating n-type or p-type impurities in the layer of semiconductor material. A conventional MOSFET geometry is known as a planar device geometry in which the various parts of the MOSFET are laid down as planes or layers.

Another type of MOSFET geometry is a non-planar FET known generally as a VTFET. VTFETs employ semiconductor fins and side-gates that can be contacted outside the active region, resulting in increased device density and some increased performance over lateral/planar devices. In VTFETs, the source-to-drain current flows in a direction that is perpendicular to a major surface of the substrate. For example, in a known VTFET configuration a major substrate surface is horizontal, and a vertical fin extends upward from the substrate surface. The fin forms the channel region of the transistor. A source region and a drain region are situated in electrical contact with the top and bottom ends of the channel region, while a gate is disposed on one or more of the fin sidewalls.

SUMMARY

Embodiments of the invention are directed to a method of forming an integrated circuit (IC). The method includes performing fabrication operations that form the IC, wherein the fabrication operations include forming a channel fin. A gate structure is formed along a sidewall surface of the channel fin. The gate structure includes a conductive gate having an L-shape profile, and the L-shape profile includes a conductive gate foot region. The conductive gate foot region is replaced with a dielectric foot region.

Embodiments of the invention are directed to a method of forming an IC. The method includes performing fabrication operations that form the IC. The fabrication operations include forming a first channel fin. A second channel fin is formed. A first gate structure is formed along a sidewall surface of the first channel fin, wherein the first gate structure includes a first conductive gate having a first L-shape profile, and wherein the first L-shape profile includes a first conductive gate foot region. A second gate structure is formed along a sidewall surface of the second channel fin, wherein the second gate structure includes a second conductive gate having a second L-shape profile, and wherein the second L-shape profile includes a second conductive gate foot region. The first conductive gate foot region is replaced with a first dielectric foot region. The second conductive gate foot region is replaced with a second dielectric foot region.

Embodiments of the invention are directed to an IC that includes a first channel fin. A first gate structure is along a sidewall surface of the first channel fin. The first gate structure includes a first conductive gate having a first L-shape profile. The first L-shape profile includes a first conductive gate leg region and a first dielectric foot region.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present invention is particularly pointed out and distinctly claimed in the claims at the conclusion of the specification. The foregoing and other features and advantages are apparent from the following detailed description taken in conjunction with the accompanying drawings in which:

FIGS. 2-11 depict 2D cross-sectional view(s) of the IC shown in FIG. 1 after fabrication operations in accordance with aspects of the invention, in which:

FIG. 2 depicts 2D cross-sectional views of an IC after fabrication operations according to embodiments of the invention;

FIG. 3 depicts 2D cross-sectional views of an IC after fabrication operations according to embodiments of the invention;

FIG. 4 depicts 2D cross-sectional views of an IC after fabrication operations according to embodiments of the invention;

FIG. 5 depicts 2D cross-sectional views of an IC after fabrication operations according to embodiments of the invention;

FIG. 6 depicts 2D cross-sectional views of an IC after fabrication operations according to embodiments of the invention;

FIG. 7 depicts 2D cross-sectional views of an IC after fabrication operations according to embodiments of the invention;

FIG. 8 depicts 2D cross-sectional views of an IC after fabrication operations according to embodiments of the invention;

FIG. 9 depicts 2D cross-sectional views of an IC after fabrication operations according to embodiments of the invention;

FIG. 10 depicts a 2D cross-sectional view of an IC after fabrication operations according to embodiments of the invention; and FIG. 11 depicts a 2D cross-sectional view of an IC after fabrication operations according to embodiments of the invention.

Figure 1:
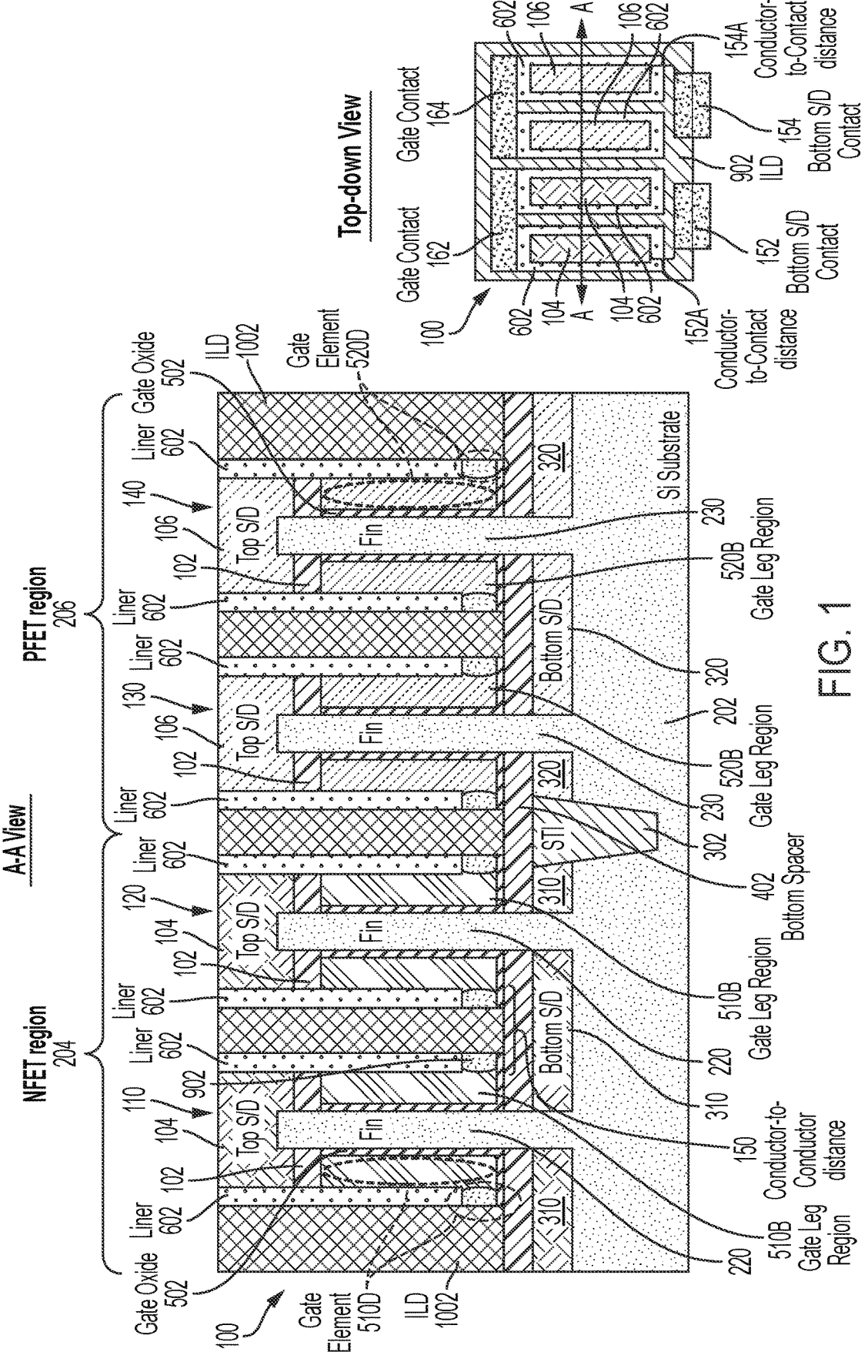
FIG. 1 depicts two-dimensional (2D) cross-sectional views of a portion of an IC having VTFETs formed thereon in accordance with embodiments of the invention.

In the accompanying figures and following detailed description of the embodiments, the various elements illustrated in the figures are provided with three or four digit reference numbers. The leftmost digit(s) of each reference number corresponds to the figure in which its element is first illustrated.

DETAILED DESCRIPTION

It is understood in advance that, although this description includes a detailed description of the formation and resulting structures for a specific type of VTFET, implementation of the teachings recited herein are not limited to a particular type of VTFET or IC architecture. Rather embodiments of the present invention are capable of being implemented in conjunction with any other type of VTFET or IC architecture, now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as previously noted herein, some non-planar transistor device architectures, such as VTFETs, employ semiconductor fins and side-gates that can be contacted outside the active region, which results in increased device density over lateral devices. A known VTFET architecture includes a channel fin; a bottom source or drain (S/D) region communicatively coupled to a bottom region of the channel fin; a bottom spacer over the bottom S/D region; a top S/D region communicatively coupled to a top region of the channel fin; a top spacer beneath the top S/D region; and a gate structure (i.e., the gate metal plus the gate dielectric) wrapped around sidewalls of the channel fin and positioned between the top spacer and the bottom spacer.

A problem with known VTFET architectures is controlling unwanted parasitic capacitance that can occur between conductive VTFET elements that are separated by dielectric material. Another problem with known VTFET architectures is forming contacts with the active elements (source, drain, and/or gate) within the relatively small spaces that result from device scaling. Where contacts need to be made in small spaces, the margins for error are low, which increases the likelihood that short circuits can occur if, for example, a S/D contact that must fit within a small space unintentionally makes contact with a nearby gate metal.

Turning now to an overview of aspects of the present invention, embodiments of the invention provide improved fabrication methodologies and resulting structures for VTFETs configured and arranged to provide improved control over parasitic capacitance (e.g., gate-to-gate, gate-to-source, gate-to-drain, etc.) and/or electrical short circuits that can occur between a gate and a bottom S/D contact formed in a relatively small space. Embodiments of the invention provide a conductive gate having an L-shaped profile that includes a conductive gate leg region and a conductive gate foot region. In accordance with aspects of the invention, the conductive gate foot region is replaced with a dielectric foot region to form a post-foot-replacement gate element having a conductive gate leg region and a dielectric foot region. Thus, the VTFET gate structure in accordance with aspects of the invention includes a gate element (the gate leg region and the dielectric foot region) and a gate dielectric. The gate element has an L-shape profile defined by the conductive gate leg region and the dielectric foot region.

For a given VTFET, replacing its conductive gate foot region with a dielectric foot region results in the bottom surface of the remaining conductive gate region (i.e., the gate leg region) having less surface area, which results in reduced parasitic capacitance between the bottom surface of the remaining conductive gate region (i.e., the gate leg region) and the portions of the highly-doped bottom S/D region that are positioned below the remaining conductive gate region. For adjacent VTFETs, replacing their conductive gate foot regions with dielectric foot regions results in the conductive regions of adjacent L-shape post-foot-replacement gate elements being further apart from one another than they would have been if the conductive gate foot regions had not been replaced with dielectric foot regions. With greater distance between the conductive regions of adjacent L-shape post-foot-replacement gate elements, unwanted parasitic capacitance between the conductive regions of the adjacent L-shape post-foot-replacement gate elements is controlled and reduced in comparison to the adjacent L-shape pre-foot-replacement conductive gates.

In embodiments of the invention, a bottom S/D contact is coupled to a top surface of the bottom S/D region of the VTFET. In accordance with aspects of the invention, replacing the conductive gate foot region with a dielectric foot region provides greater space between the conductive regions of the L-shape post-foot-replacement gate element and the bottom S/D contact, thereby reducing the likelihood that the conductive regions of the L-shape post-foot-replacement gate structure will contact the bottom S/D contact and cause a short circuit, particularly when the bottom S/D contact is floor-planned to fit within relatively a small space having relatively small tolerances. The additional space provided by removing the conductive gate foot region can also be allocated to the channel fin, which allows the channel fin to be longer. For example, if a length dimension of the channel fin is about 20 nm, and if a length dimension of the conductive gate region is about 5 nm, removing the conductive gate region allows an additional 5 nm in length to be allocated to the channel fin, thereby increasing the channel fin length from 20 nm to 25 nm.

Turning now to a more detailed description of aspects of the invention, FIG. 1 depicts a top-down 2D cross-sectional view of a portion of an IC structure 100, along with a 2D cross-sectional view of the IC structure 100 taken along line A-A of the top-down view, wherein both views depict features and functions of VTFET devices in accordance with aspects of the invention. As best shown in the A-A view of FIG. 1, the IC 100 includes an NFET region 204 and a PFET region 206. The NFET region 204 includes VTFETs 110, 120, and the PFET region 206 includes VTFETs 130, 140. In embodiments of the invention, the VTFETs 110, 120 are two in-series n-type VTFETs formed in the NFET region 204 of the Si wafer/substrate 202, and the VTFETs 130, 140 are two in-series p-type VTFETs formed in the PFET region 206 of the Si wafer/substrate 202. The number of p-type and n-type VTFETs shown in the figures is for ease of illustration, and in practice any number of p-type and n-type VTFETs can be provided. In the example depicted in FIG. 1, each of the n-type VTFETs 110, 120 in the NFET region 204 includes a channel fin 220, a shared highly-doped S/D region 310, a bottom spacer 402, a top spacer 102, a top n-doped S/D region 104, a protective liner 602, a gate dielectric 502, and a gate element 510D, configured and arranged as shown. In accordance with aspects of the invention, the gate element 510D has an L-shape profile that includes a conductive gate leg region 510B and a dielectric foot region 902, configured and arranged as shown. In the example depicted in FIG. 1, each of the p-type VTFETs 130, 140 in the PFET region 206 includes a channel fin 230, a highly-doped S/D region 320, the bottom spacer 402, the top spacer 102, a top p-doped S/D region 106, the protective liner 602, the gate dielectric 502, and a gate element 520D, configured and arranged as shown. In accordance with aspects of the invention, the gate element 520D has an L-shape profile that includes a conductive gate leg region 520B and the dielectric foot region 902, configured and arranged as shown.

In embodiments of the invention, the conductive gate leg regions 510B, 520B can be (or can include) work function metal(s) (WFM). The type of WFM depends on the type of transistor and can differ between the nFET and pFET devices. The conductive gate leg region 510B includes p-type WFMs, examples of which include compositions such as ruthenium, palladium, platinum, cobalt, nickel, and conductive metal oxides, or any combination thereof. The conductive gate leg region 520B includes n-type WFMs, examples of which include compositions such as hafnium, zirconium, titanium, tantalum, aluminum, metal carbides (e.g., hafnium carbide, zirconium carbide, titanium carbide, and aluminum carbide), aluminides, or any combination thereof. The conductive gate leg regions 510B, 520B can further include tungsten (W), titanium (Ti), aluminum (Al), cobalt (Co), or nickel (Ni) conductive material(s) over their WFM layer(s). In some embodiments of the invention, the conductive material or a combination of multiple conductive materials can serve as both the gate conductor element and the WFM.

Figure 7:
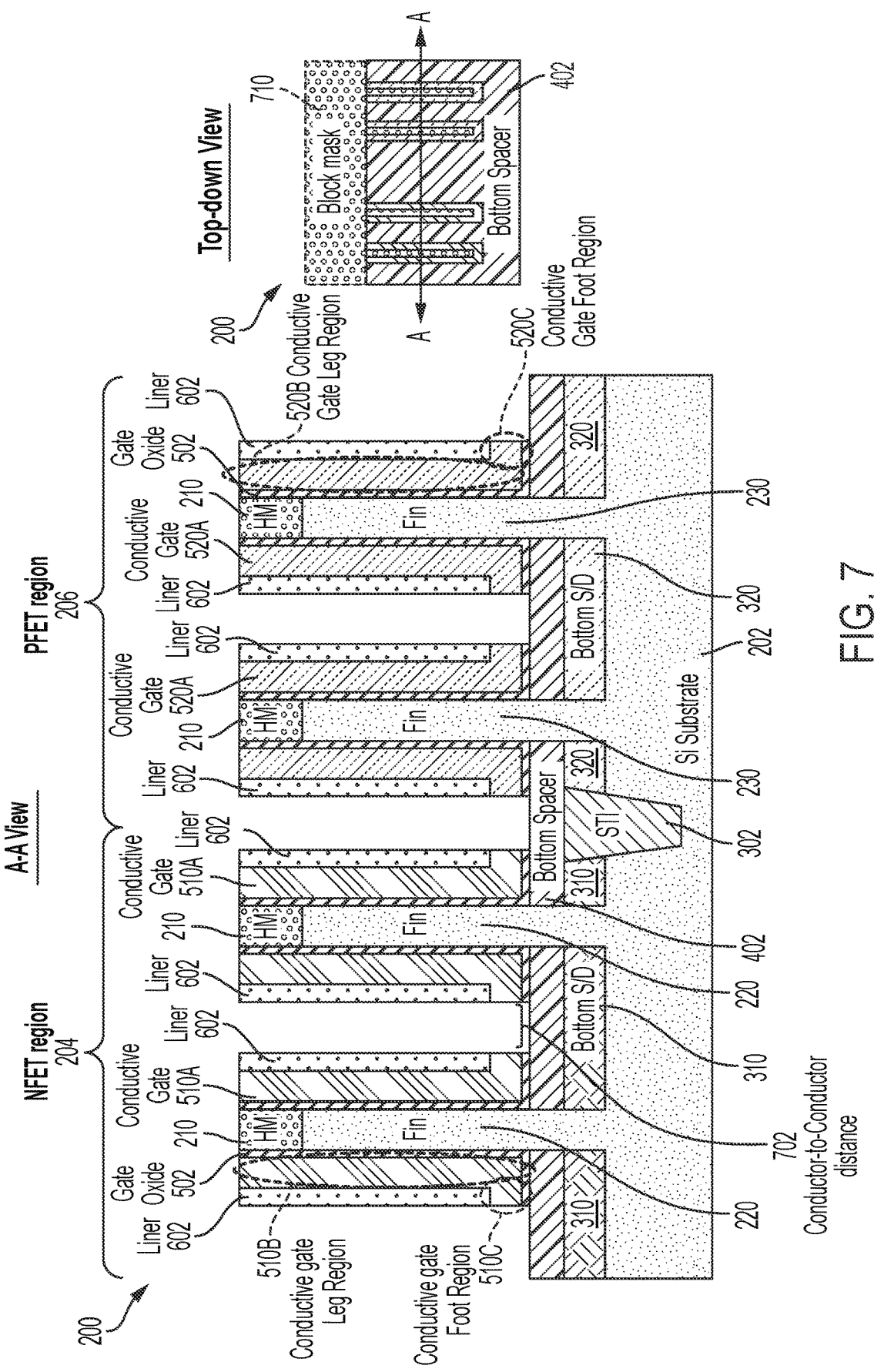
Figure 8:
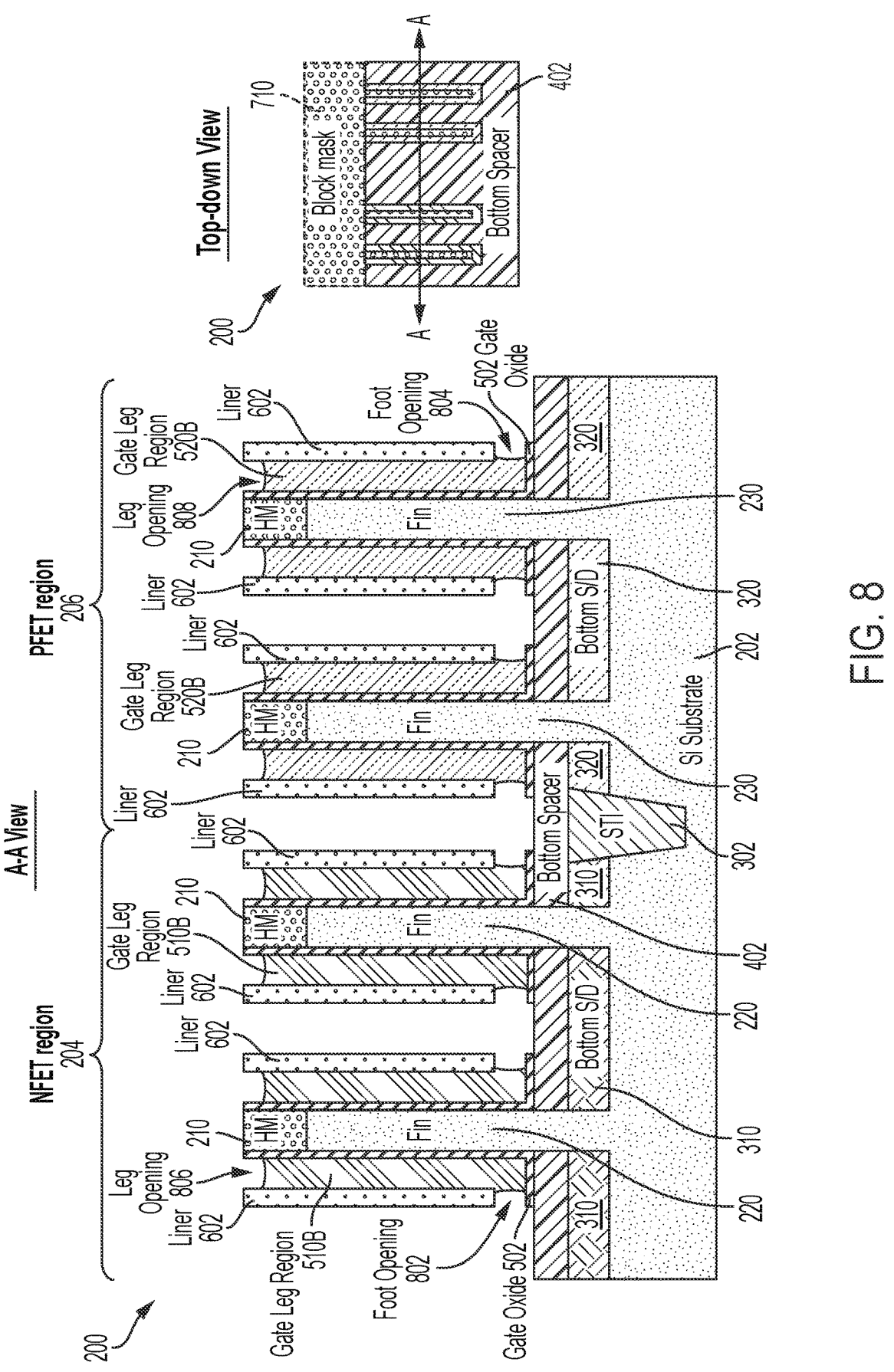
Figure 9:
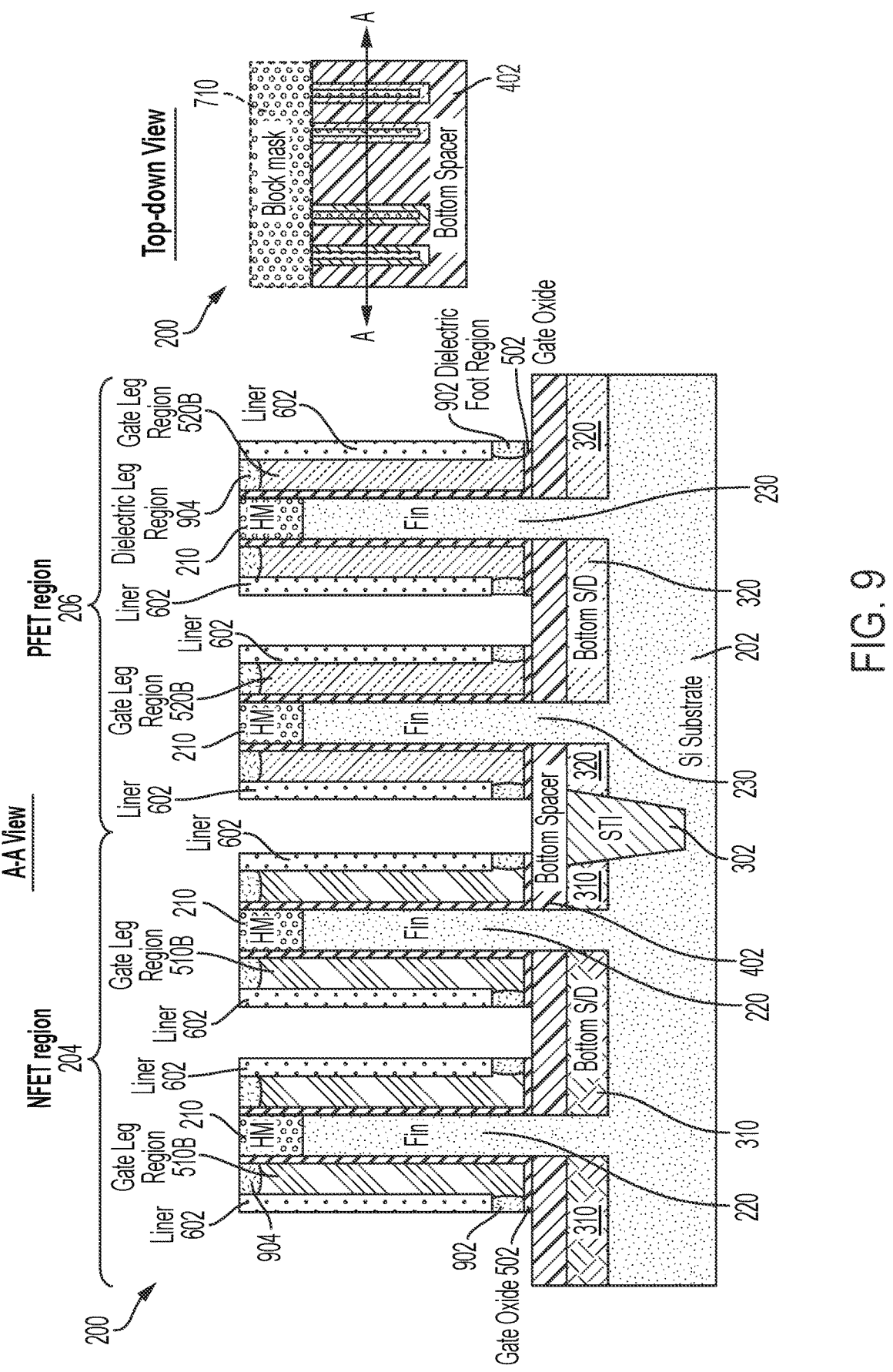

Referring still to FIG. 1, in accordance with aspects of the invention, the VTFETs 110, 120, 130, 140 are configured and arranged to provide improved control over parasitic capacitance (e.g., conductor-to-conductor distance 150 shown in the A-A view) and/or electrical short circuits that can occur between the conductive gate leg regions 510B, 520B and the bottom S/D contacts 152, 154 (shown in the top-down view), wherein the bottom S/D contacts 152, 154 are formed in relatively small spaces having relatively small tolerances. During fabrication of the IC 100, in accordance with embodiments of the invention, conductive gates 510A, 520A are each formed to include an L-shaped profile that includes the conductive gate leg region 510B, 520B (as shown in FIG. 7), respectively, along with a corresponding conductive gate foot region 510C, 520C (as shown in FIG. 7), respectively. In accordance with aspects of the invention, each of the conductive gate foot regions 510C, 520C is replaced with the dielectric foot region 902 (as shown in FIGS. 8 and 9).

Referring still to FIG. 1, for a given VTFET 110, 120, 130, 140, replacing its conductive gate foot region 510C, 520C (shown in FIG. 7) with a dielectric foot region 902 (shown in FIG. 9) results in the bottom surface of the remaining conductive region (i.e., the gate leg region 510B, 520C) of the gate element 510D, 520D having less surface area. This reduced conductor surface area results in reduced parasitic capacitance between the bottom surface of the gate leg region 510B, 520B and the portions of the highly-doped bottom S/D region 310, 320 that are positioned below the gate leg region 510B, 520B.

Referring still to FIG. 1, because the VTFETs 110 120, 130, 140 are adjacent to one another, replacing the conductive gate foot regions 510C, 520C with the dielectric foot regions 902 results in the conductive regions (i.e., the gate leg region 510B, 520B) of adjacent ones of the L-shape adjacent post-foot-replacement gate elements 510D, 520D, respectively, being further apart from one another than they would have been if the conductive gate foot regions 510C, 520C had not been replaced with dielectric foot regions 902. The conductive regions of the L-shape adjacent post-footreplacement gate elements 510D, 520D being further apart from one another than they would have been if the conductive gate foot regions 510C, 520C had not been replaced with dielectric foot regions 902 is depicted by the conductor-to-conductor distance 150 and the conductor-to-conductor distance 702 (shown in FIG. 7), wherein the distance 150 is greater than the distance 702. With greater distance between conductive regions of adjacent ones of the L-shape post-foot-replacement gate elements 510D, 520D, unwanted parasitic capacitance between adjacent ones of the L-shape the post-foot-replacement gate elements 510D, 520D is controlled and reduced in comparison to adjacent ones of the L-shape conductive gates 510A, 520A (shown in FIG. 7).

As best shown in the top-down view of FIG. 1, in embodiments of the invention, bottom S/D contacts 152, 154 are coupled to a top surface of the highly-doped S/D regions 310, 320 of the VTFETs 110, 120, 130, 140. In accordance with aspects of the invention, replacing the conductive gate foot region 510C (shown in FIG. 7) with the dielectric foot region 902 provides greater space (e.g., distances 152A, 154A) between the conductive regions of the L-shape post-foot-replacement gate element(s) 510D, 520D and the bottom S/D contacts 152, 154, thereby reducing the likelihood that the conductive regions of the L-shape post-foot-replacement gate elements 510D, 520D will contact the bottom S/D contacts 152, 154 and cause short circuits, particularly when the bottom S/D contacts 152, 154 are floor-planned to fit within relatively small spaces with relatively small tolerances.

Turning now to a more detailed description of embodiments of the invention, FIGS. 2-11 depict two-dimensional (2D) cross-sectional views of an IC under-fabrication 200 after fabrication operations according to embodiments of the invention. The fabrication operations depicted in FIGS. 1-11 are applied to the IC under-fabrication 200 to form the IC 100 (shown in FIG. 1) having VTFETs 110, 120, 130, 140 (shown in FIG. 1).

Figure 2:
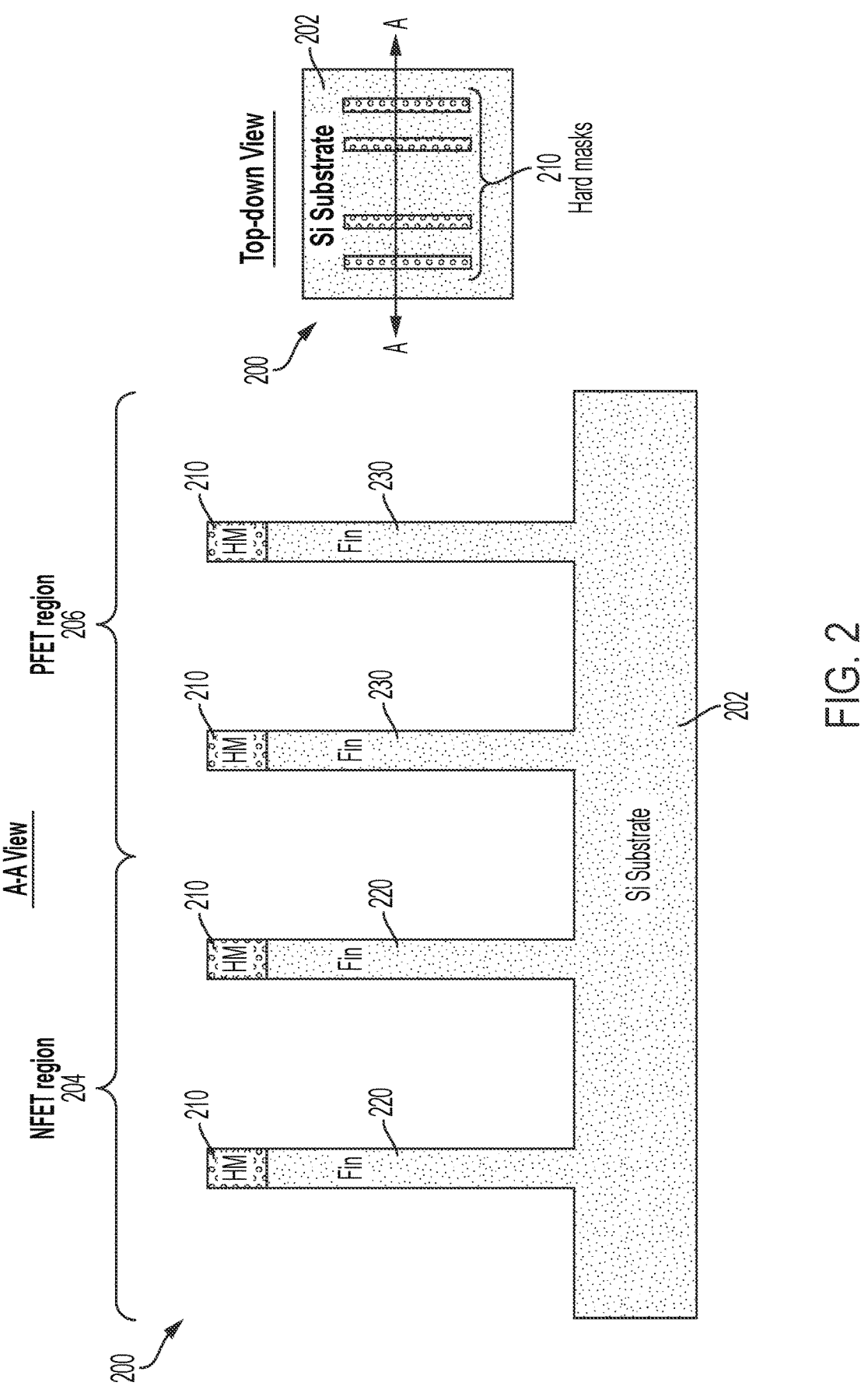

In FIG. 2, known semiconductor fabrication operations have been used to form the IC under-fabrication 200 having a substrate 202, channel fins 220, 230, and hard masks 210, configured and arranged as shown. The substrate 202 includes a substantially horizontal top surface and can be any suitable substrate material, such as, for example, monocrystalline Si, SiGe, SiC, III-V compound semiconductor, II-VI compound semiconductor, or semiconductor-on-insulator (SOI). In some embodiments of the invention, the substrate 202 includes a buried oxide layer (not depicted).

The channel fins 220, 230 can be formed by depositing a hard mask layer (not shown) over an initial substrate (not shown) using any suitable deposition process. For example, the hard mask layer can be a dielectric such as silicon nitride (SiN), silicon oxide, or a combination of silicon oxide and silicon nitride. Conventional semiconductor device fabrication processes (e.g., patterning and lithography, self-aligned double patterning, self-aligned quadruple patterning) are used to remove portions of the initial substrate and the hard mask layer to form the channel fins 220, 230 and the hard masks 210. More specifically, the hard mask layer can be patterned to expose portions of the initial substrate. The exposed portions of the initial substrate can be removed or recessed using, for example, a wet etch, a dry etch, or a combination thereof, to thereby form the channel fins 220, 230 and the hard masks 210.

Figure 3:
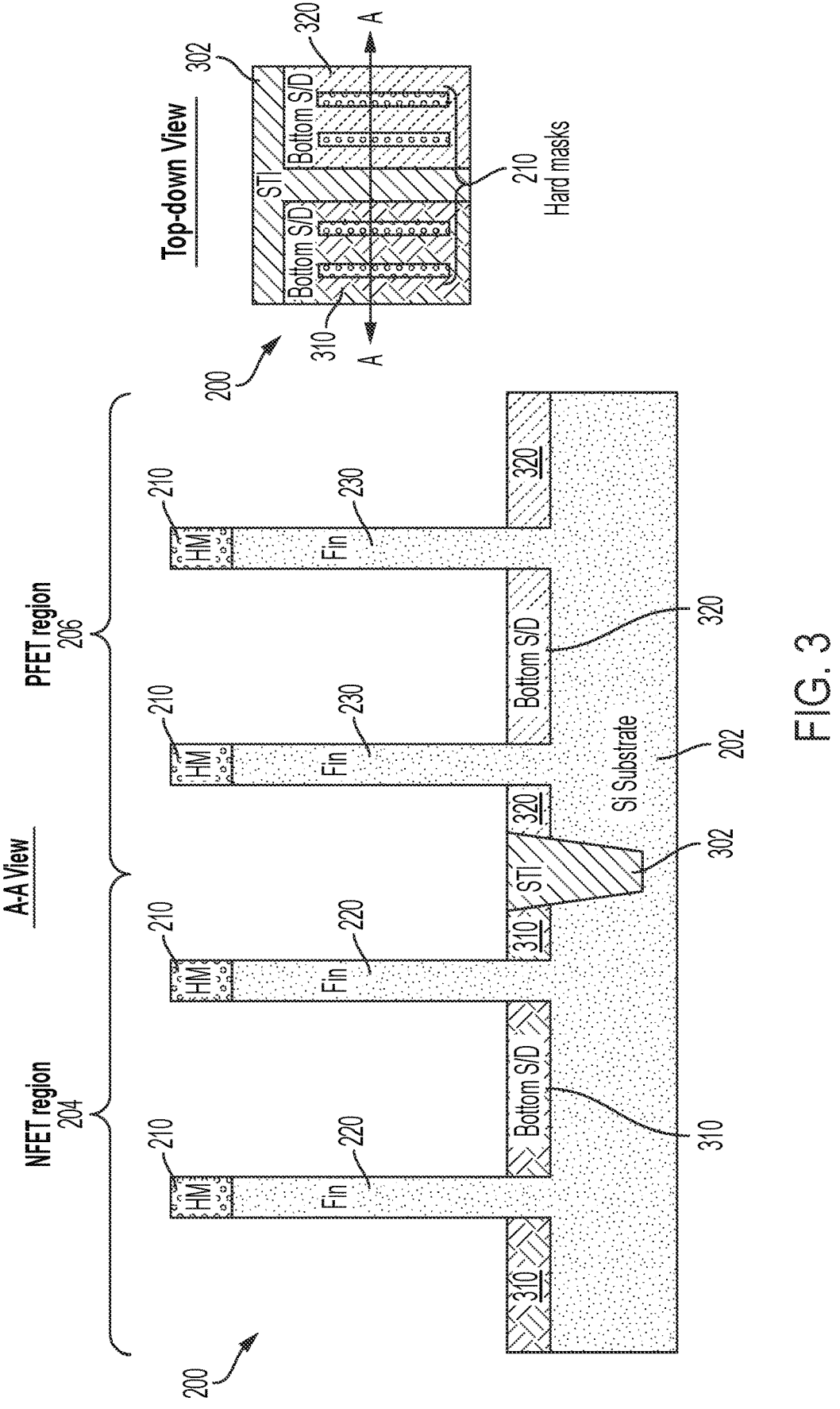

In FIG. 3, the channel fins 220 and the channel fin 230 are electrically isolated from other regions of the substrate 202 by forming a shallow trench isolation (STI) region 302. The STI region 302 can be formed by patterning and etching the substrate 202 to form an STI trench (not shown), filling the trench with a suitable dielectric, planarizing the dielectric, and then etching the dielectric to form the STI region 302. The STI region 302 can be formed from any suitable dielectric material (e.g., a silicon oxide material).

As also shown in FIG. 3, the highly-doped S/D regions 310, 320 are formed using conventional fabrication techniques. The NFET region 204 is block masked while the highly-doped S/D region 320 is formed, and the PFET region 206 is block masked while the highly-doped S/D region 310 is formed. In some embodiments of the invention, the highly-doped S/D regions 310, 320 can be formed by doping selected regions of the substrate 202. In some embodiments of the invention, the highly-doped S/D regions 310, 320 can be formed later in the fabrication process. In some embodiments of the invention, the highly-doped S/D regions 310, 320 can be epitaxially grown, and the necessary doping (n-type doping or p-type doping) to form the bottom S/D regions 310, 320 is provided through in-situ doping during the epitaxial growth process, or through ion implantation. In embodiments of the invention, the bottom S/D regions 310, 320 can be doped using any suitable doping technique, including but not limited to, ion implantation, gas phase doping, plasma doping, plasma immersion ion implantation, cluster doping, infusion doping, liquid phase doping, solid phase doping, in-situ epitaxy growth, or any suitable combination of those techniques.

Figure 4:
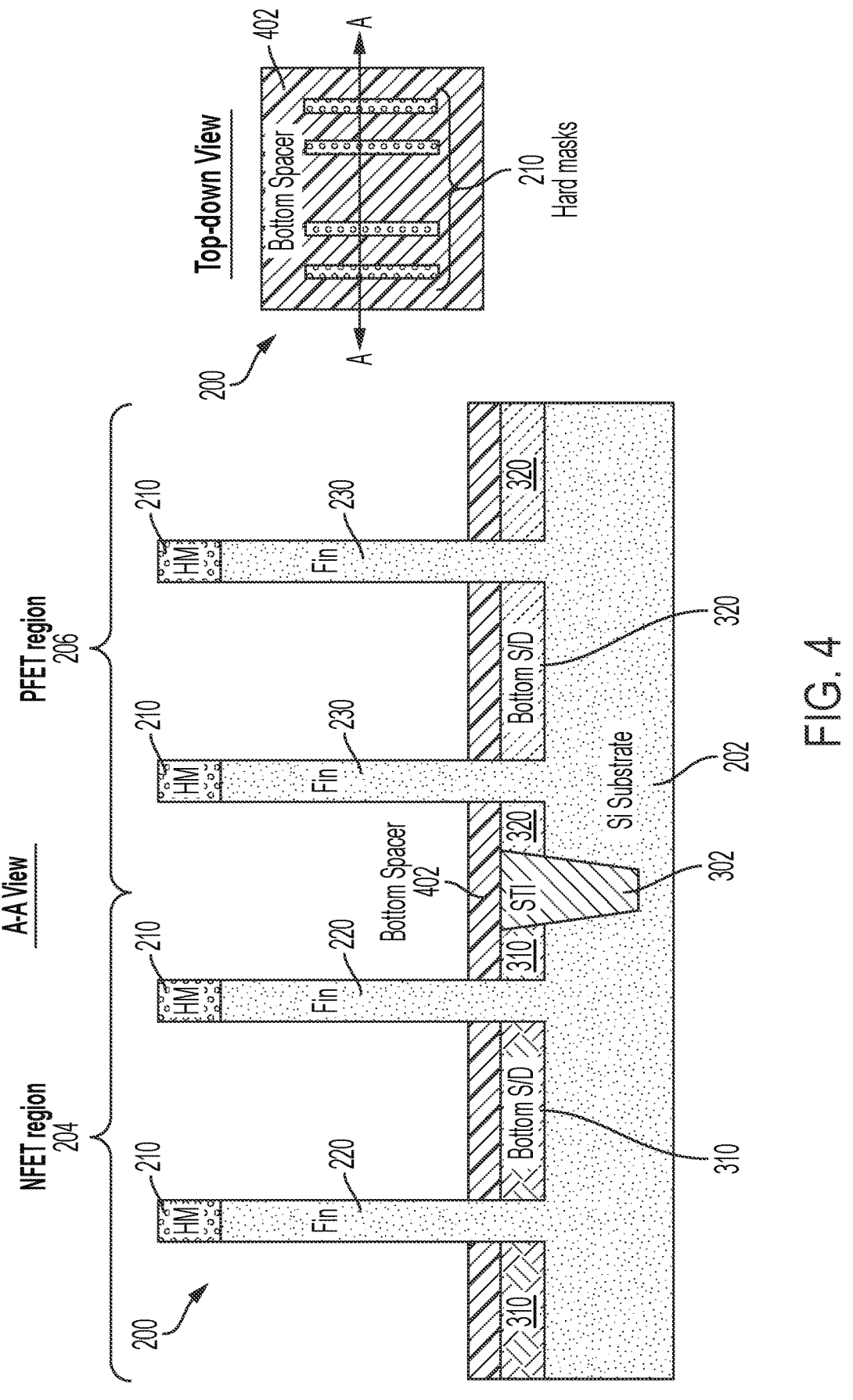
Figure 5:
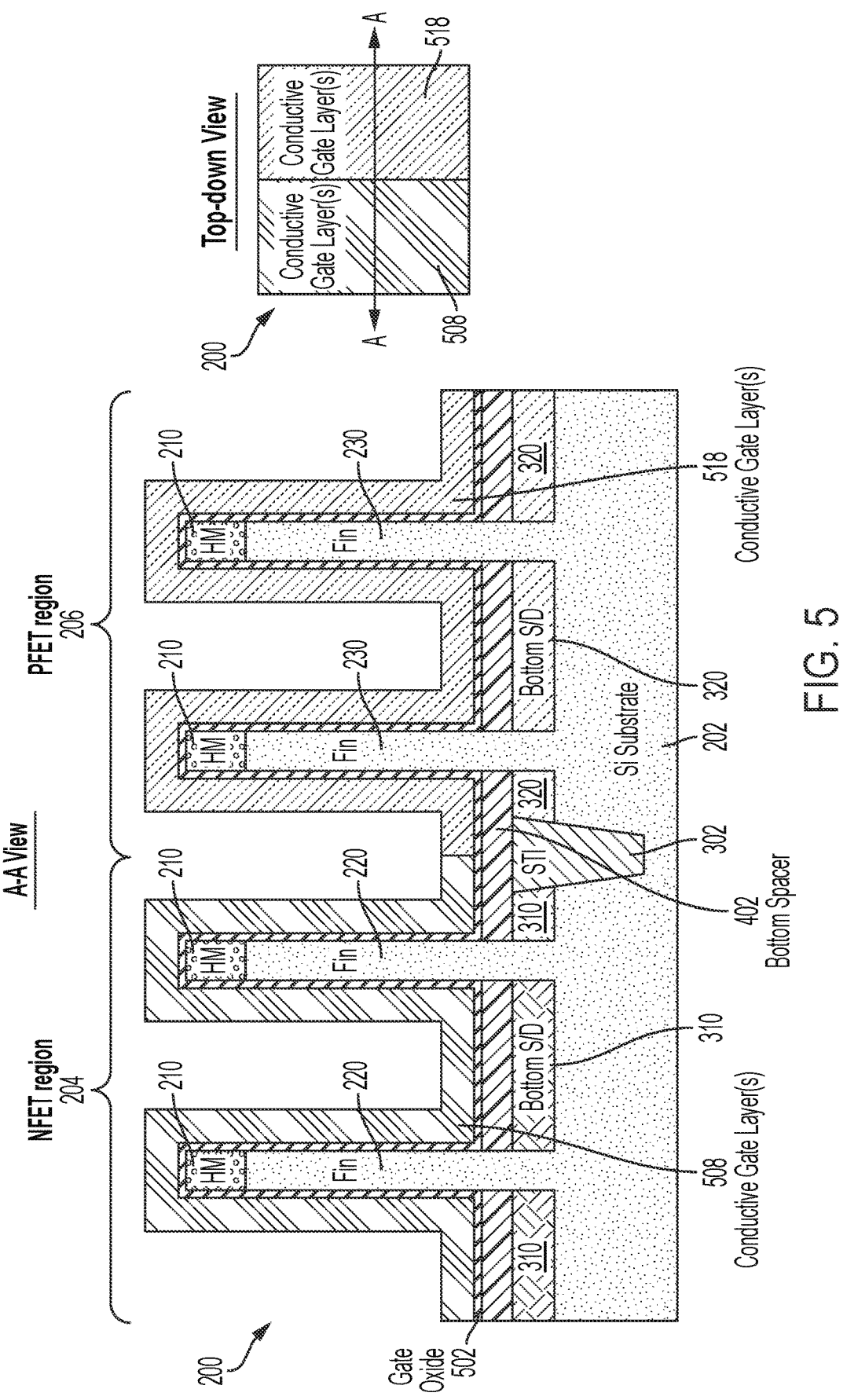

In FIG. 4, the bottom spacer 402 is formed over the bottom S/D regions 310, 320 and a major surface of the substrate 202. In embodiments of the invention the bottom spacer 402 is formed across from the doped bottom S/D regions 310, 320 and adjacent to bottom portions of the channel fins 220, 230. The bottom spacer 402 can include a dielectric material, such as, for example, SiN, SiC, SiOC, SiCN, BN, SiBN, SiBCN, SiOCN, $SiO_xN_y$, and combinations thereof. The dielectric material can be a low-k material having a dielectric constant less than about 7, less than about 5, or even less than about 2.5. The bottom spacer 402 can be formed using known deposition processes, such as, for example, CVD, PECVD, ALD, PVD, chemical solution deposition, or other like processes to deposit a conformal layer. A directional etch can be applied to remove the In FIG. 5, a gate dielectric 502 and conductive gate layers 510, 520 have been deposited over the bottom spacer 402 and the channel fins 220, 230. The gate dielectric 502 can be formed from one or more gate dielectric films. The gate dielectric films can be a dielectric material having a dielectric constant greater than, for example, 3.9, 7.0, or 10.0. Non-limiting examples of suitable materials for the high-k dielectric films include oxides, nitrides, oxynitrides, silicates (e.g., metal silicates), aluminates, titanates, nitrides, or any combination thereof. The gate dielectric 502 can be of a composite structure having, for example, a first interlayer oxide layer (e.g., SiO, SiNO) and a second layer of high-k material. Examples of high-k materials with a dielectric constant greater than 7.0 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric films can further include dopants such as, for example, lanthanum and aluminum. The gate dielectric films can be formed by suitable deposition processes, for example, CVD, PECVD, atomic layer deposition (ALD), evaporation, physical vapor deposition (PVD), chemical solution deposition, or other like processes. The thickness of the gate dielectric films can vary depending on the deposition process as well as the composition and number of high-k dielectric materials used.

The conductive gate layers 510, 520 are formed using conventional fabrication techniques. The NFET region 204 is block masked while the conductive gate layers 520 are formed, and the PFET region 206 is block masked while the conductive gate layers 510 are formed. The conducive gate layers 510, 520 can include gate conductors formed from conductive material such as doped polycrystalline or amorphous silicon; germanium; silicon germanium; a metal (e.g., tungsten, titanium, tantalum, ruthenium, zirconium, cobalt, copper, aluminum, lead, platinum, tin, silver, gold); a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide); carbon nanotube; conductive carbon; graphene; or any suitable combination of these materials. The conductive material can further include dopants that are incorporated during or after deposition. In some embodiments of the invention, the gate conductors can be a WFM deposited over the gate dielectric 502 by a suitable deposition process, for example, CVD, PECVD, PVD, plating, thermal or e-beam evaporation, and sputtering. The type of WFM depends on the type of transistor and can differ between the nFET and pFET devices. P-type WFMs include compositions such as ruthenium, palladium, platinum, cobalt, nickel, and conductive metal oxides, or any combination thereof. N-type WFMs include compositions such as hafnium, zirconium, titanium, tantalum, aluminum, metal carbides (e.g., hafnium carbide, zirconium carbide, titanium carbide, and aluminum carbide), aluminides, or any combination thereof. The gate conductors can further include a tungsten (W), titanium (Ti), aluminum (Al), cobalt (Co), or nickel (Ni) material over the WFM layer of the conductive gate layers 510, 520. The conductive gate layers 510, 520 can be deposited by a suitable deposition process, for example, CVD, PECVD, PVD, plating, thermal or e-beam evaporation, and sputtering.

Figure 6:
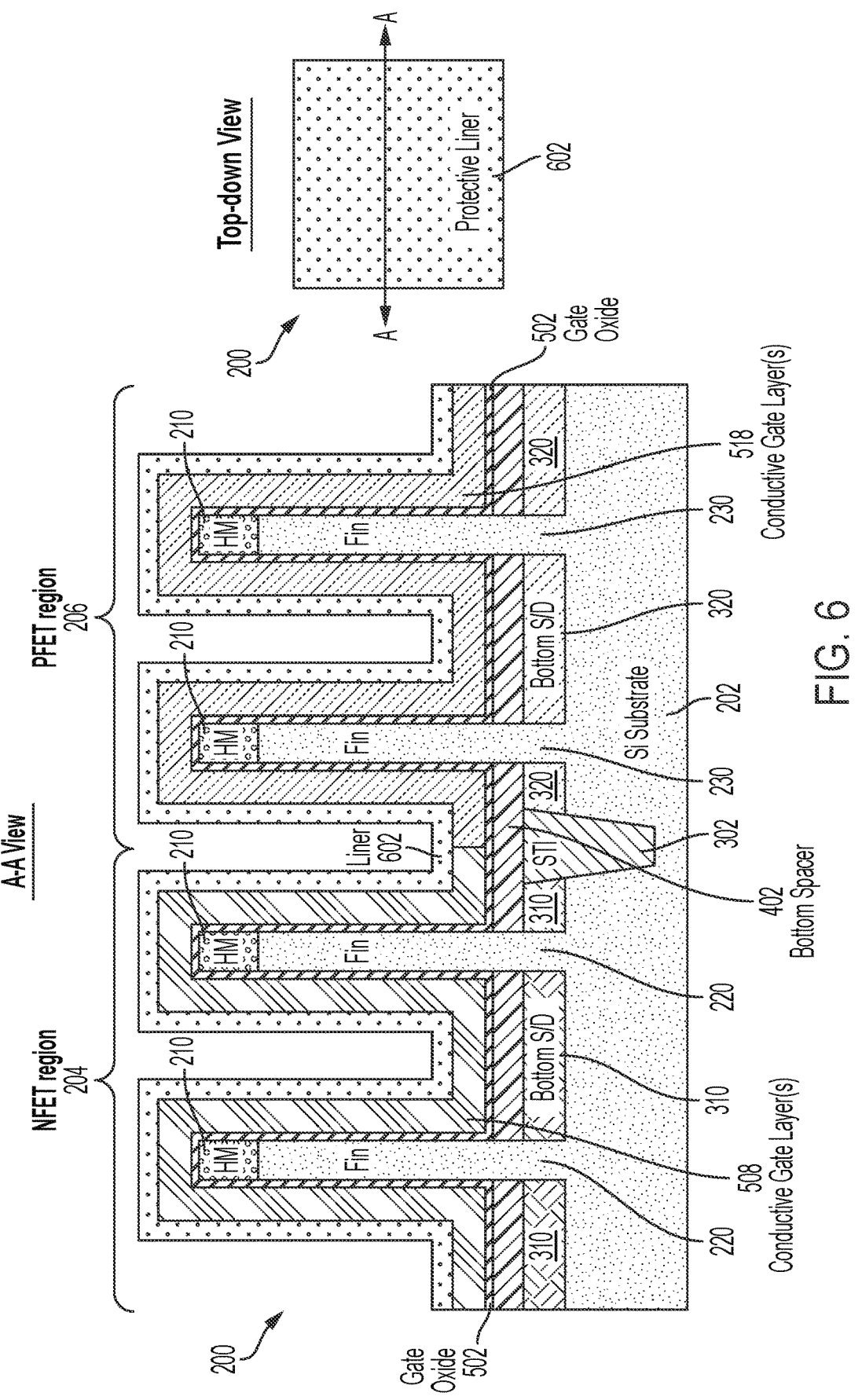

In FIG. 6, the protective (or encapsulating) liner 602 has been deposited over the conductive gate layers 510, 520. The protective liner 602 can be formed from one or more dielectric materials suitable for protecting the conductive gate layers 510, 520 during subsequent fabrication operations (e.g., the gate RIE). In some embodiments of the invention, the protective liner 602 can be formed from SiN. The protective liner 602 can be formed by suitable deposition processes, for example, CVD, PECVD, atomic layer deposition (ALD), evaporation, physical vapor deposition (PVD), chemical solution deposition, or other like processes.

In FIG. 7, known semiconductor fabrication operations have been used to etch portions of the protective liner 602, conductive gate layers 510, 520, and the gate dielectric 502 to expose portions of top surfaces of the bottom spacer 402. In embodiments of the invention, any of the known suitable processes for etching metals/conductors can be used, along with any of the known suitable processes for etching dielectric material. In embodiments of the invention, the protective liner 602, conductive gate layers 510, 520, and the gate dielectric 502 that are not intended to be etched will be protected, for example by using a mask (not shown). As best shown in the top-down view of FIG. 7, a block mask 710 is provided to protect and define a gate contact region of the IC under-fabrication 200. The gate contacts 162, 164 (shown in the top-down view of FIG. 1) will be formed in the gate contact region defied by the block mask 710.

After the fabrication operations depicted in FIG. 7, the conductive gate layers 510 have been etched to form conductive gates 510A, each of which includes an L-shape profile. The L-shape profile is defined by a conducive gate leg region 510B and a conductive gate foot region 510C. A distance between adjacent instances of the conductive gates 510A is shown in FIG. 7 as a conductor-to-conductor distance 702. Similarly, the conductive gate layers 520 have been etched to form conductive gates 520A, each of which includes an L-shape profile. The L-shape profile is defined by a conducive gate leg region 520B and a conductive gate foot region 520C. A distance between adjacent instances of the conductive gates 520A is substantially the same as the conductor-to-conductor distance 702.

In FIG. 8, an anisotropic metal etch is applied to primarily (or more quickly) etch the conductive gates 510A, 520A in downward directions than lateral directions to substantially remove the conductive gate foot regions 510C, 520C and form foot openings 802, 804, and leg openings 806, 808. The NFET region 204 is block masked while the foot openings 804 are formed, and the PFET region 206 is block masked while the foot openings 802 are formed. In embodiments of the invention, any of the known suitable processes for performing an anisotropic metal etch can be used.

In FIG. 9, known semiconductor fabrication processes have been used to conformally deposit a dielectric layer (not shown) over the IC under-fabrication 200. In embodiments of the invention, the dielectric layer has sufficient thickness to pinch-off and fill in the foot openings 802, 804 and the leg openings 806, 808. A non-directional etch is applied to remove the dielectric layer from everywhere except the foot openings 802, 804 and the leg openings 806, 80, thereby forming the dielectric foot regions 902 and the dielectric leg regions 904. The dielectric foot regions 902 and the dielectric leg regions 904 can be any suitable dielectric material, including, for example, SiN.

Figure 10:
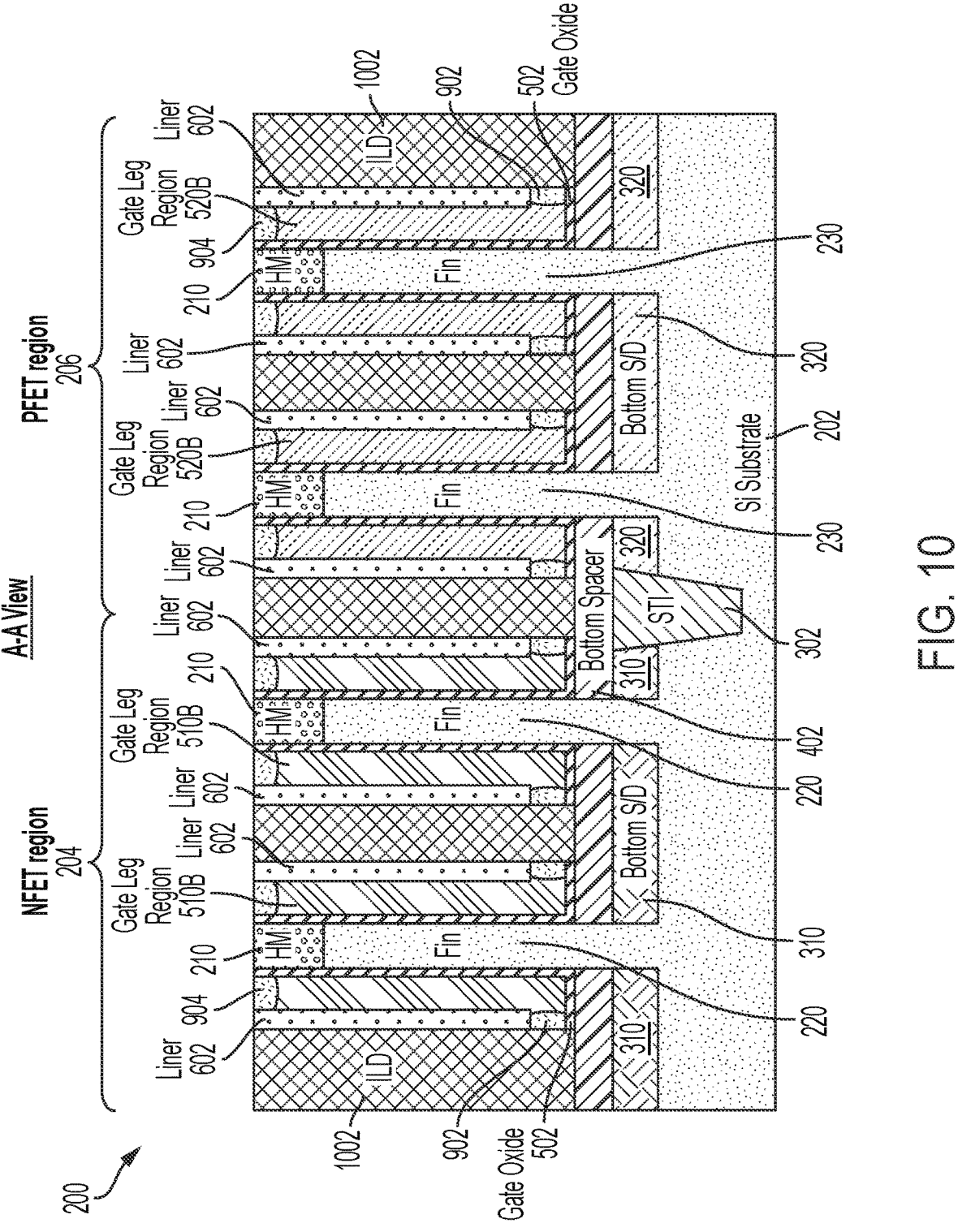

In FIG. 10, known semiconductor device fabrication processes have been used to deposit an ILD 1002 to fill in remaining open spaces of the IC under-fabrication 200 and stabilize the structure of the IC under-fabrication 200. In aspects of the invention, the deposited ILD regions 1002 can be formed from a low-k dielectric (e.g., k less than about 4) and/or an ultra-low-k (ULK) dielectric (e.g., k less than about 2.5). After deposition of the ILD 1002, the IC under-fabrication 200 can be planarized using any suitable planarization process such as a chemical mechanical planarization (CMP) process.

Figure 11:
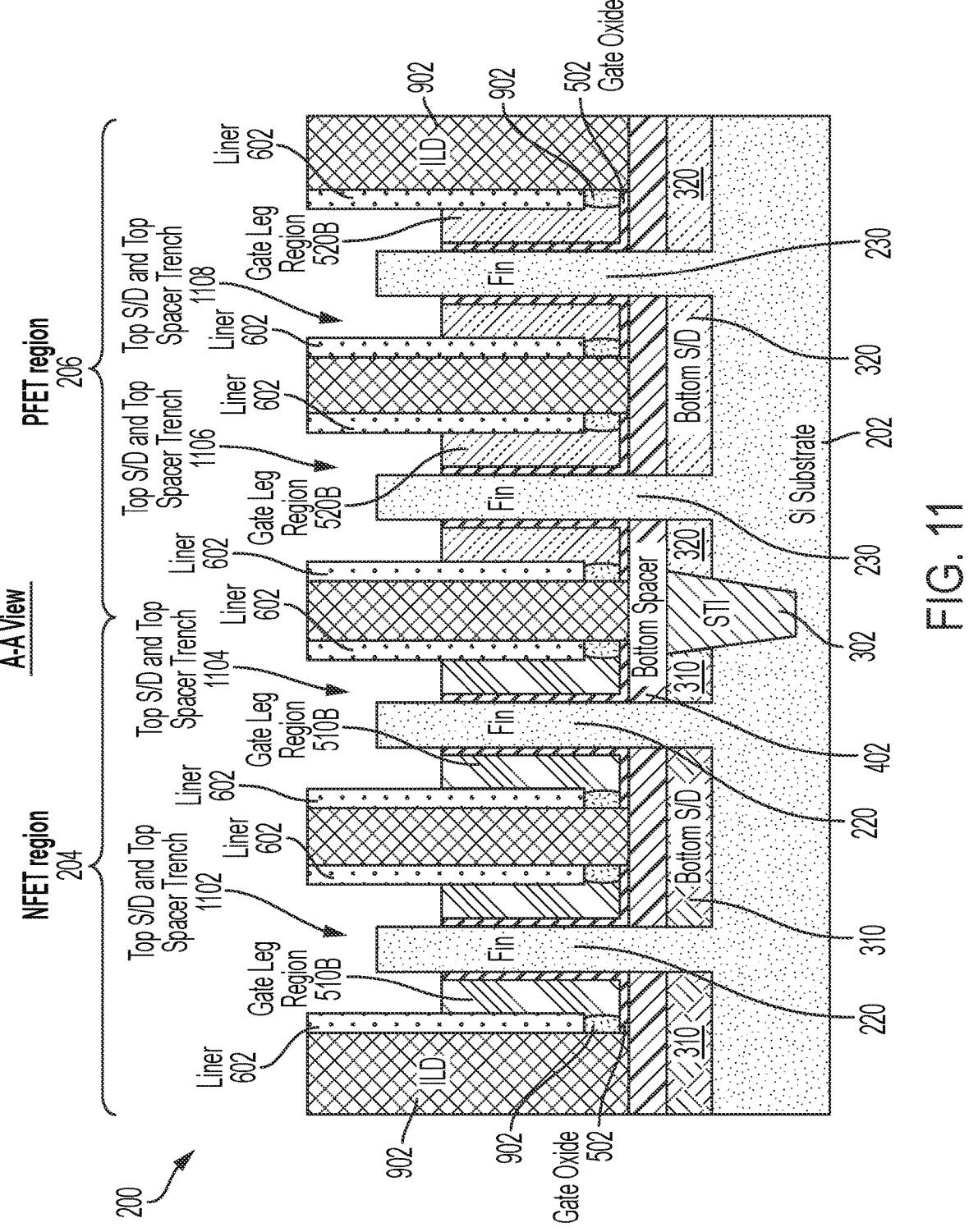

In FIG. 11, known semiconductor device fabrication processes have been used to form top S/D and top spacer trenches 1102, 1104, 1106, 1108. The NFET region 204 is block masked while the top S/D and top spacer trenches 1106, 1108 are formed, and the PFET region 206 is block masked while the top S/D and top spacer trenches 1102, 1104 are formed. The trenches 1102, 1104, 1106, 1108 are formed by recessing and removing the hard masks 210, the dielectric leg regions 904, and portions of the gate dielectric 502. The trenches 1102, 1104, 1106, 1108 are further formed by recessing and removing portions of the gate leg regions 510B, 520B, thereby exposing upper regions of the fins 220, 230. Each trench 1102, 1104, 1106, 1108 includes an inverted U-shape that extends around a circumference of upper regions of the fins 220, 230.

After the fabrication operations depicted in FIG. 11, fabrication operations are performed on the IC under-fabrication 200 to form the IC 100 shown in FIG. 1 having top spacers 102 and top S/D regions 104, 106, configured and arranged as shown. Known semiconductor fabrication processes have been used to form top spacers 102 within the trenches 1102, 1104, 1106, 1108 and over portions of the gate leg regions 510B, 520B. The top spacers 102 can be formed from and/or include a dielectric material, such as, for example, SiN, SiC, SiOC, SiCN, BN, SiBN, SiBCN, SiOCN, $SiO_xN_y$, and combinations thereof. The dielectric material can be a low-k material having a dielectric constant less than about 7, less than about 5, or even less than about 2.5. The top spacers 102 can be formed using known deposition processes, such as, for example, CVD, PECVD, ALD, PVD, chemical solution deposition, other directional deposition techniques, or other like processes. In embodiments of the invention, the top spacers 102 can be deposited to include an overburden then etched back to a desired level. In some embodiments of the invention, the desired level is below top surfaces of the fins 220, 230, thereby leaving exposed a top surface and portions of the sidewalls of each of the fins 220, 230.

As best shown in the A-A view of FIG. 1, known fabrication operations have been used to form the top S/D regions 104, 106 on the top surfaces and exposed sidewalls of the fins 220, 230. In embodiments of the invention, the top S/D regions 104, 106 are epitaxially grown, and the necessary doping to form the top S/D regions 104, 106 is provided through in-situ doping during the epitaxial growth process. The top S/D regions 104, 106 can be doped by any suitable doping technique, including but not limited to, ion implantation, gas phase doping, plasma doping, plasma immersion ion implantation, cluster doping, infusion doping, liquid phase doping, solid phase doping, in-situ epitaxy growth, or any suitable combination of those techniques. The top S/D regions 104 are doped with n-type impurities, and the top S/D regions 106 are doped with p-type impurities.

As best shown in the top-down view of FIG. 1, known fabrication operations have been used to form the S/D contacts 152, 154 and the gate contacts 162, 164. The S/D contacts 152, 154 extend through trenches (not shown) formed in the ILD 1002 and are configured to communicatively couple to the bottom S/D regions 310, 320, respectively. Similarly, the gate contacts 162, 164 extend through trenches (not shown) formed in the ILD 1002 and are configured to communicatively couple to the gate leg regions 510B, 520B, respectively. A liner/barrier material (not shown) is deposited within the trenches formed in the ILD 1002, and the remaining trench volumes are filled with contact metal (e.g., copper) using, for example, a chemical/electroplating process, to thereby form the S/D contacts 152, 154 and the gate contacts 162, 164. The excess contact metal is removed to form a flat surface for subsequent processing. In accordance with aspects of the invention, replacing the conductive gate foot region 510C (shown in FIG. 7) with the dielectric foot region 902 provides greater space (e.g., distances 152A, 154A) between the conductive regions of the L-shape post-foot-replacement gate element(s) 510D, 520D and the bottom S/D contacts 152, 154, thereby reducing the likelihood that the conductive regions of the L-shape post-foot-replacement gate elements 510D, 520D will contact the bottom S/D contacts 152, 154 and cause short circuits, particularly when the bottom S/D contacts 152, 154 are floor-planned to fit within relatively small spaces with relatively small tolerances.

In downstream processing, known fabrication operations are used to deposit an additional ILD material (not shown), and additional S/D contacts (not shown) are formed in the additional ILD material to contact the top S/D regions 104, 106. In embodiments of the invention, the additional S/D contacts can be formed by forming trenches in the additional ILD material. The trenches are positioned over the top S/D regions 104, 106 to which electrical coupling will be made. A liner/barrier material (not shown) is deposited within the trenches, and the remaining trench volumes are filled with contact metal (e.g., copper) (not shown) using, for example, a chemical/electroplating process, to thereby form the additional S/D contacts. The excess copper is removed to form a flat surface for subsequent processing. A cap layer (not shown) can be deposited over the exposed top surface of the additional S/D contacts.

The methods described herein are used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/ connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming an integrated circuit (IC), the method comprising performing fabrication operations that form the IC, wherein the fabrication operations comprise:

forming a channel fin;

forming a gate structure along a sidewall surface of the channel fin;

wherein the gate structure comprises a conductive gate having an L-shape profile;

wherein the L-shape profile comprises a conductive gate leg region and a conductive gate foot region, the conductive gate foot region comprising a conductive gate foot region top surface extending over an entirety of the conductive gate foot region and intersecting a sidewall of the conductive gate leg region;

forming a protective liner along the sidewall of the conductive gate leg region, such that an entirety of a bottom surface of the protective liner extends over an entirety of the conductive gate foot region top surface; and replacing the entirety of the conductive gate foot region with a dielectric foot region such that a space that was occupied by the conductive gate foot region is occupied by the dielectric foot region;

wherein at least a portion of the space that was occupied by the conductive gate foot region is defined by a portion of the protective liner and a portion of the conductive gate leg region.

2. The method of claim 1, wherein the conductive gate leg region is along the sidewall surface of the channel fin.

3. The method of claim 1, wherein the conductive gate comprises a work function metal.

4. The method of claim 1, wherein the dielectric foot region is non-sacrificial in that the dielectric foot region is present in a final version of the IC.

5. The method of claim 3, wherein the work function metal comprises a p-type work function metal or an n-type work function metal.

6. The method of claim 2, wherein the fabrication operations further comprise:

forming a bottom source or drain (S/D) region communicatively coupled to a bottom end region of the channel fin; and forming a bottom S/D contact communicatively coupled to the bottom S/D region;

wherein the dielectric foot region is between a portion of the conductive gate leg and a portion of the bottom S/D contact.

7. A method of forming an integrated circuit (IC), the method comprising performing fabrication operations that form the IC, wherein the fabrication operations comprise:

forming a first channel fin;

forming a second channel fin;

forming a first gate structure along a sidewall surface of the first channel fin;

wherein the first gate structure comprises a first conductive gate having a first L-shape profile;

wherein the first L-shape profile comprises a first conductive gate leg region and a first conductive gate foot region, the first conductive gate foot region comprising a first conductive gate foot region top surface extending over an entirety of the first conductive gate foot region and intersecting a sidewall of the first conductive gate leg region;

forming a first protective liner along the sidewall of the first conductive gate leg region, such that an entirety of a bottom surface of the first protective liner extends over an entirety of the first conductive gate foot region top surface;

forming a second gate structure along a sidewall surface of the second channel fin;

wherein the second gate structure comprises a second conductive gate having a second L-shape profile;

wherein the second L-shape profile comprises a second conductive gate leg region and a second conductive gate foot region, the second conductive gate foot region comprising a second conductive gate foot region top surface extending over an entirety of the second conductive gate foot region and intersecting a sidewall of the second conductive gate leg region;

forming a second protective liner along the sidewall of the second conductive gate leg region, such that an entirety of a bottom surface of the second protective liner extends over an entirety of the second conductive gate foot region top surface;

replacing the entirety of the first conductive gate foot region with a first dielectric foot region such that a space that was occupied by the first conductive gate foot region is occupied by the first dielectric foot region;

wherein at least a portion of the space that was occupied by the first conductive gate foot region is defined by a portion of the first protective liner and a portion of the first conductive gate leg region; and replacing the entirety of the second conductive gate foot region with a second dielectric foot region such that a space that was occupied by the second conductive gate foot region is occupied by the second dielectric foot region;

wherein at least a portion of the space that was occupied by the second conductive gate foot region is defined by a portion of the second protective liner and a portion of the second conductive gate leg region.

8. The method of claim 7, wherein:

the first conductive gate leg region is along the sidewall surface of the first channel fin; and the second conductive gate leg region is along the sidewall surface of the second channel fin.

9. The method of claim 7, wherein the first conductive gate and the second conductive gate comprise a work function metal.

10. The method of claim 7, wherein the first dielectric foot region and the second dielectric foot region are non-sacrificial in that the first dielectric foot region and the second dielectric foot region are present in a final version of the IC.

11. The method of claim 9, wherein the work function metal comprises a p-type work function metal or an n-type work function metal.

12. The method of claim 8, wherein a portion of the first dielectric foot region and a portion of the second dielectric foot region are between a bottom region of the first conductive gate leg region and a bottom region of the second conductive gate leg region.

13. The method of claim 8, wherein the fabrication operations further comprise:

forming a shared bottom source or drain (S/D) region communicatively coupled to a bottom end region of the first channel fin and a bottom end region of the second channel fin; and forming a bottom S/D contact communicatively coupled to the shared bottom S/D region;

wherein the first dielectric foot region and the second dielectric foot region are between:

a portion of the first conductive gate leg and a portion of the shared bottom S/D contact; and a portion of the second conductive gate leg and the portion of the shared bottom S/D contact.

14. An integrated circuit (IC) comprising:

a first channel fin; and a first gate structure along a sidewall surface of the first channel fin;

wherein the first gate structure comprises a first conductive gate having a first L-shape profile;

wherein the first L-shape profile comprises a first conductive gate leg region and a first dielectric foot region, the first dielectric foot region comprising a first dielectric foot region top surface extending over an entirety of the first dielectric foot region and intersecting a sidewall of the first conductive gate leg region; and a first protective liner along the sidewall of the first conductive gate leg region, such that an entirety of a bottom surface of the first protective liner extends over an entirety of the first dielectric foot region top surface;

wherein a space occupied by the first dielectric foot region was previously occupied by a removed first conductive gate foot region; and wherein at least a portion of the space that was occupied by the removed first conductive gate foot region is defined by a portion of the first protective liner and a portion of the first conductive gate leg region.

15. The IC of claim 14 further comprising:

a second channel fin; and a second gate structure along a sidewall surface of the second channel fin;

wherein the second gate structure comprises a second conductive gate having a second L-shape profile;

wherein the second L-shape profile comprises a second conductive gate leg region and a second dielectric foot region, the second dielectric foot region comprising a second dielectric foot region top surface extending over an entirety of the second dielectric foot region and intersecting a sidewall of the second conductive gate leg region; and a second protective liner along the sidewall of the second conductive gate leg region, such that an entirety of a bottom surface of the second protective liner extends over an entirety of the second dielectric foot region top surface;

wherein a space occupied by the second dielectric foot region was previously occupied by a removed second conductive gate foot region; and wherein at least a portion of the space that was occupied by the removed second conductive gate foot region is defined by at portion of the second protective liner and a portion of the second conductive gate leg region.

16. The IC of claim 15, wherein the first conductive gate and the second conductive gate comprise a work function metal.

17. The IC of claim 15, wherein the first dielectric foot region and the second dielectric foot region are non-sacrificial in that the first dielectric foot region and the second dielectric foot region are present in a final version of the IC.

18. The IC of claim 16, wherein the work function metal comprises a p-type work function metal or an n-type work function metal.

19. The IC of claim 15, wherein a portion of the first dielectric foot region and a portion of the second dielectric foot region are between a bottom region of the first conductive gate leg region and a bottom region of the second conductive gate leg region.

20. The IC of claim 15 further comprising:

a shared bottom source or drain (S/D) region communicatively coupled to a bottom end region of the first channel fin and a bottom end region of the second channel fin; and a bottom S/D contact communicatively coupled to the shared bottom S/D region;

wherein the first dielectric foot region and the second dielectric foot region are between:

a portion of the first conductive gate leg and a portion of the shared bottom S/D contact; and a portion of the second conductive gate leg and the portion of the shared bottom S/D contact.

* * * * *